(12) United States Patent  (10) Patent No.: US 7,087,471 B2
Beintner  (45) Date of Patent: Aug. 8, 2006

(54) LOCALLY THINNED FINS

(75) Inventor: Jochen C. Beintner, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/800,850

(22) Filed: Mar. 15, 2004

(65) Prior Publication Data

US 2005/0202608 A1 Sep. 15, 2005

(51) Int. Cl.
*H01L 21/00* (2006.01)

(52) U.S. Cl. ............... 438/164; 438/218; 438/294; 438/514; 438/410; 438/157; 438/283; 438/481; 438/156; 438/151

(58) Field of Classification Search ........... 438/164, 438/218, 294, 514, 410, 157, 283, 481, 156, 438/151
See application file for complete search history.

(56) References Cited

U.S. PATENT DOCUMENTS

| | | | |
|---|---|---|---|
| 6,252,284 B1 * | 6/2001 | Muller et al. ............... | 257/412 |
| 6,413,802 B1 * | 7/2002 | Hu et al. ..................... | 438/151 |
| 6,475,869 B1 * | 11/2002 | Yu ............................. | 438/303 |
| 6,642,090 B1 * | 11/2003 | Fried et al. ................. | 438/164 |
| 6,812,075 B1 * | 11/2004 | Fried et al. ................. | 438/157 |
| 6,855,607 B1 * | 2/2005 | Achuthan et al. ........... | 438/283 |
| 6,864,164 B1 * | 3/2005 | Dakshina-Murthy et al. ........................... | 438/585 |
| 2004/0256647 A1 * | 12/2004 | Lee et al. .................... | 257/289 |
| 2004/0266076 A1 * | 12/2004 | Doris et al. ................. | 438/157 |
| 2004/0266077 A1 * | 12/2004 | Yeo et al. .................... | 438/157 |
| 2005/0014314 A1 * | 1/2005 | Dokumaci et al. .......... | 438/151 |
| 2005/0029603 A1 * | 2/2005 | Yu et al. ...................... | 257/401 |
| 2005/0036415 A1 * | 2/2005 | Yoshida et al. .......... | 369/47.53 |

\* cited by examiner

*Primary Examiner*—David Zarneke
*Assistant Examiner*—Victor V. Yevsikov
(74) *Attorney, Agent, or Firm*—Wan Yee Cheung

(57) ABSTRACT

In a FinFET integrated circuit, the fins are formed with a reduced body thickness in the body area and then thickened in the S/D area outside the body to improve conductivity. The thickening is performed with epitaxial deposition while the lower portion of the gates are covered by a gate cover layer to prevent thickening of the gates at the fin level, which may short the gate to the S/D.

20 Claims, 10 Drawing Sheets

LOCALLY THINNED FINS

TECHNICAL FIELD

The field of the invention is that of fabricating field effect transistors having a body extending perpendicular to the semiconductor substrate between horizontally disposed source and drain regions, referred to as a "FinFET".

BACKGROUND OF THE INVENTION

Metal-Oxide-Semiconductor field effect transistor (MOSFET) technology is the dominant electronic device technology in use today. Performance enhancement between generations of devices is generally achieved by reducing the size of the device, resulting in an enhancement in device speed. This is generally referred to as device "scaling".

Ultra-large-scale integrated (ULSI) circuits generally include a multitude of transistors, such as more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or polysilicon/germanium ($Si_xGe_{(1-x)}$) material that controls charge carriers in a channel region between the drain and the source to turn the transistor on and off. The transistors can be N-channel MOSFETs or P-channel MOSFETs.

In bulk semiconductor-type devices, transistors such as MOSFETs, are built on the top surface of a bulk substrate. The substrate is doped to form source and drain regions, and a conductive layer is provided between the source and drain regions. The conductive layer operates as a gate for the transistor; the gate controls current in a channel between the source and the drain regions. As transistors become smaller, the body thickness of the transistor (or thickness of depletion layer below the inversion channel) must be scaled down to achieve superior short-channel performance.

As MOSFETs are scaled to channel lengths below 100 nm, conventional MOSFETs suffer from several problems. In particular, interactions between the source and drain of the MOSFET degrade the ability of the gate to control whether the device is on or off. This phenomenon is called the "short-channel effect".

Silicon-on-insulator (SOI) MOSFETs are formed with an insulator (usually, but not limited to, silicon dioxide) below the device active region, unlike conventional "bulk" MOSFETs, which are formed directly on silicon substrates, and hence have silicon below the active region.

Conventional SOI-type devices include an insulative substrate attached to a thin-film semiconductor substrate that contains transistors similar to the MOSFETs described with respect to bulk semiconductor-type devices. The insulative substrate generally includes a buried insulative layer above a lower semiconductor base layer. The transistors on the insulative substrate have superior performance characteristics due to the thin-film nature of the semiconductor substrate and the insulative properties of the buried insulative layer. In a fully depleted (FD) MOSFET, the body thickness is so small that the depletion region has a limited vertical extension, thereby eliminating link effect and lowering hot carrier degradation. The superior performance of SOI devices is manifested in superior short-channel performance (i.e., resistance to process variations in small size transistors), near-ideal subthreshold voltage swing (i.e., good for low off-state current leakage), and high saturation current. SOI is advantageous since it reduces unwanted coupling between the source and the drain of the MOSFET through the region below the channel. This is often achieved by ensuring that all the silicon in the MOSFET channel region can be either inverted or depleted by the gate (called a fully depleted SOI MOSFET). As device size is scaled, however, this becomes increasingly difficult, since the distance between the source and drain is reduced, and hence, they increasingly interact with the channel, reducing gate control and increasing short channel effects (SCE).

The double-gate MOSFET structure is promising since it places a second gate in the device, such that there is a gate on either side of the channel. This allows gate control of the channel from both sides, reducing SCE. Additionally, when the device is turned on using both gates, two conduction ("inversion") layers are formed, allowing for more current flow. An extension of the double-gate concept is the "surround-gate" or "wraparound-gate" concept, where the gate is placed such that it completely or almost-completely surrounds the channel, providing better gate control.

In a double gate field effect transistor (FinFET), the device channel comprises a thin silicon fin standing on an insulative layer (e.g. silicon oxide) with the gate in contact with the sides of the fin. Thus inversion layers are formed on the sides of the channel with the channel film being sufficiently thin such that the two gates control the entire channel film and limit modulation of channel conductivity by the source and drain.

The double gates on the channel fin effectively suppress SCE and enhance drive current. Further, since the fin is thin, doping of the fin is not required to suppress SCE and undoped silicon can be used as the device channel, thereby reducing mobility degradation due to impurity scattering. Further, the threshold voltage of the device may be controlled by adjusting the work function of the gate by using a silicon-germanium alloy or a refractory metal or its compound such as titanium nitride.

Generally, it is desirable to manufacture smaller transistors to increase the component density on an integrated circuit. It is also desirable to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

Heretofore, lithographic tools are utilized to form transistors and other structures on the integrated circuit. For example, lithographic tools can be utilized to define gate conductors, active lines conductive lines, vias, doped regions, and other structures associated with an integrated circuit. Most conventional lithographic fabrication processes have only been able to define structures or regions having a dimension of 100 nm or greater.

In one type of conventional lithographic fabrication process, a photoresist mask is coated over a substrate or a layer above the substrate. The photoresist mask is lithographically patterned by providing electromagnetic radiation, such as ultraviolet light, through an overlay mask. The portions of the photoresist mask exposed to the electromagnetic radiation react (e.g. are cured). The uncured portions of the photoresist mask are removed, thereby transposing the pattern associated with the overlay to the photoresist mask. The patterned photoresist mask is utilized to etch other mask layers or structures. The etched mask layer and structures, in turn, can be used to define doping regions, other structures, vias, lines, etc.

As the dimensions of structures or features on the integrated circuit reach levels below 100 nm or 50 nm, lithographic techniques are unable to precisely and accurately define the feature. For example, as described above, reduction of the width of the gate conductor (the gate length) associated with a transistor or of the active lines associated with an SOI transistor has significant beneficial effects. Future designs of transistors may require that the active lines have a width of less than 50 nanometers. Double gate SOI MOSFETs have received significant attention because of its advantages related to high drive current and high immunity to short channel effects. The double-gate MOSFET is able to increase the drive current because the gate surrounds the active region by more than one layer (e.g., the effective gate total width is increased due to the double gate structure). However, patterning narrow, dense active regions is challenging. As discussed above with respect to gate conductors, conventional lithographic tools are unable to accurately and precisely define active regions as structures or features with dimensions below 100 nm or 50 nm.

Thus, there is a need for an integrated circuit or electronic device that includes smaller, more densely disposed active regions or active lines. Further still, there is a need for a ULSI circuit which does not utilize conventional lithographic techniques to define active regions or active lines. Even further still, there is a need for a non-lithographic approach for defining active regions or active lines having at least one topographic dimension less than 100 nanometers and less than 50 nanometers (e.g., 20–50 nm). Yet further still, there is a need for an SOI integrated circuit with transistors having multiple sided gate conductors associated with active lines having a width of about 20 to 50 nm.

The present invention is directed to a process for fabricating FinFET transistor structures which is an extension of conventional planar MOSFET technology and resulting structures.

SUMMARY OF THE INVENTION

The present invention is directed to a process for fabricating FinFET transistor structures, in which the fins in the transistor body area are decreased in thickness compared with the fins in the S/D areas.

A feature of the invention is a self-aligned gate formed in a damascene aperture.

A feature of the invention is thickening the fins in the S/D areas by epitaxial silicon growth while the transistor bodies under the gates remain at the thinned value.

A feature of the invention is the use of a gate spacer process that enables the formation of a gate spacer that covers the gate while the sidewall of the fins is cleared and thickened.

DETAILED DESCRIPTION

This invention describes a process to fabricate locally thinned fins in the body region of the transistor. The advantage of a locally thinned fin is: Higher mechanical stability of thin fins (since most of the fin is thicker and stronger than the thin region); formation of halos and extension by ion implant; and because due to the thicker fin body outside the gate not all of the silicon is amorphized and amorphized silicon can therefore be recrystallized again.

A feature of the invention is a gate spacer process that protects the gate while the sidewall of the fins is cleared from the gate spacer material (e.g. nitride) and from other materials. Clearing the fin sidewall from unwanted spacer material is quite difficult as a long overetch of the gate spacer is required. This overetch that clears the sidewall of the fins also consumes the conformal gate spacer on top and on the upper sides of the gate, thereby exposing the polysilicon gate material. Cleared fin sidewalls are necessary to increase the fin thickness outside of the gate to reduce series resistance. If polysilicon from the gate is exposed at the level of the fins, epitaxial growth will also occur on the gate in that area and can cause shorting of gate and source/drain during silicidation.

Figure 1A:
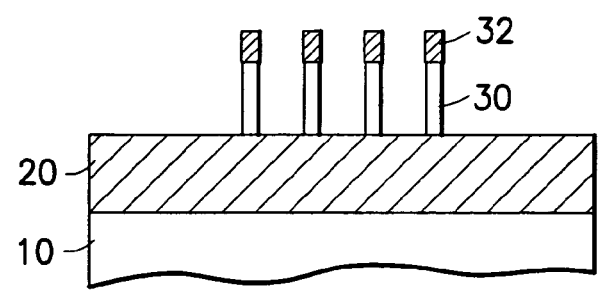
FIGS. 1A and 1B show in cross section a preliminary step in the process of forming the invention, showing fins formed before the gate formation.
Figure 1B:
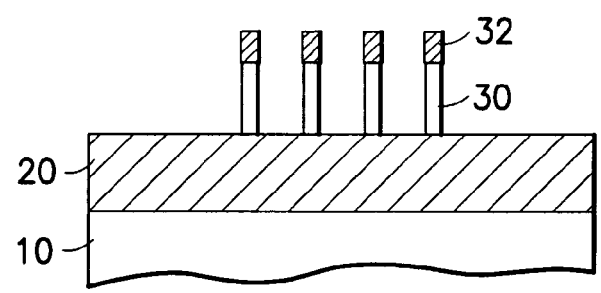
Figure 1C:
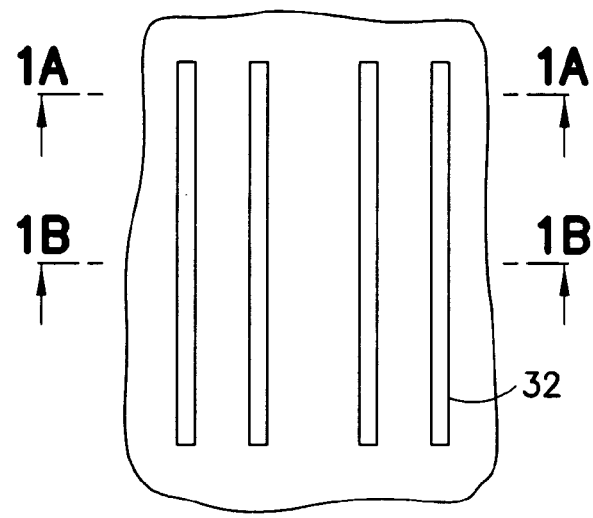
FIG. 1C is a top view showing the location of the other Figures.

Referring now to FIG. 1, there is shown in cross section a portion of an integrated circuit that will contain a set of FinFET transistors. Wafer 10 may be bulk silicon or an SOI wafer. The SOI wafer is preferred and is illustrated here. Above substrate 10, buried oxide insulator (BOX) layer 20 has been formed by conventional processes. Sitting on top of BOX 20 are blocks of silicon 30 extending perpendicular to the plane of the paper that will form the fins of FinFETs. The plane of the cross section in FIG. 1A is taken through the source/drain (S/D) area and in FIG. 1B through the location where transistor gates will be placed in later steps. FIG. 1C is a top view showing the location of cross sections 1A and 1B. The horizontal dimensions appearing in the cross section will be referred to as transverse dimensions (and the horizontal dimension of blocks 30 is the thickness of the fins). For convenience in explanation, the top of FIG. 1C will be referred to as North, with other directions corresponding. Thus, FIG. 1A is a cross section taken at the North end of the fins, looking north. In the following figures, cross sections nA will be at the same location as 1A and cross sections nB will be at the same location as 1B.

In this example, a set of four fins shown will be controlled by a common gate. Those skilled in the art will be aware that separated gates could be formed to control one or more fins, if desired. As used herein, the term set means one or more; i.e. a FinFET may have one or more fins. The Figure shows the result of conventional preliminary steps, well known to those skilled in the art, of forming the silicon fins for a FinFET.

Narrow fin structures in silicon or silicon on insulator (SOI) can be fabricated in different ways, e.g. by optical lithography followed by different trimming techniques (resist trimming, hard mask trimming, oxidation trimming (These processes are based on width reduction of the mask by plasma etch or wet etch, or by material consumption of the fin by oxidation)), by E-beam lithography or by sidewall image transfer processes.

In the example illustrated, the sidewall image transfer process was used as the method to structure narrow fins in SOI. FIG. 1 shows a bulk wafer 10, having a buried oxide (BOX) 20 with an SOI layer 30 of 70 nm (Possible range of the SOI is ~10 nm to 200 nm, but not limited to that range). The surface of layer 30 has been oxidized to form 300 Å of thermal oxide 32 (Preferred range 50 Å–500 Å). Alternatively, an oxide can also be deposited using any kind of CVD processes.

The following discussion illustrates a conventional method, well known to those skilled in the art, of fabricating the structure shown in FIG. 1. Other methods may also be used. These initial steps are not illustrated in the Figures to avoid unnecessary detail. Initially, 1500 Å (Preferred range 500 Å–3000 Å) of temporary amorphous silicon (not shown) were deposited on the wafer surface that will be formed into the fins (oxide layer 32 on top of fin layer 30) by CVD or sputter processes, followed by the deposition of 500 Å (Preferred range 100 Å–2000 Å) of CVD oxide (not shown) as a hardmask. Optical lithography and RIE etch processes are used to structure the CVD oxide hardmask and, using the CVD oxide hardmask, the amorphous silicon layer, stopping on the oxide layer 32 on top of the SOI to form a temporary structure that supports the conformal layer that follows. Then a 200 Å (Preferred range 50 Å–500 Å) nitride layer (not shown) is deposited conformally using a CVD process followed by a RIE etch process to form SiN spacers (sidewalls) on the side of the amorphous silicon.

The amorphous silicon is then removed with a plasma etch or wet etch leaving nitride spacer structures behind. The spacer structures are used as a hardmask to structure the oxide 32 underneath and can be removed afterwards by oxide and silicon selective plasma etches or wet etches (e.g. hot phosphoric acid). The structured oxide 32 is then used as a hardmask to etch the silicon fins 30 in the SOI layer, resulting in the example shown in FIG. 1. Next, a sacrificial oxide is thermally grown to remove RIE damage from the silicon fin surface and to act as a screen oxide for fin body doping implants that can be processed at this point. Fin body doping implants are not necessary to make the FinFET device work, but can be useful to set FinFET Vt.

The sacrificial oxide is removed by a wet etch, followed by a preclean and gate oxide processing using thermal oxidation or CVD deposition processes. A specific example of the process described above is shown in copending patent application Ser. No. 10/730,234, assigned to the assignee hereof and incorporated herein by reference and omitted from this description for simplicity.

This invention describes a process to form controlled, locally thin body fins for a FinFET device with thicker source/drain regions. The advantage of this process is that high aspect ratio fins can be processed with sufficient stability and lower extension resistance. The process is based on defining an etch window for locally thinning the silicon fin. Thickness control of the fin body is one of the most critical factors in FinFET processing as it directly results in FET threshold variation.

Figure 2A:
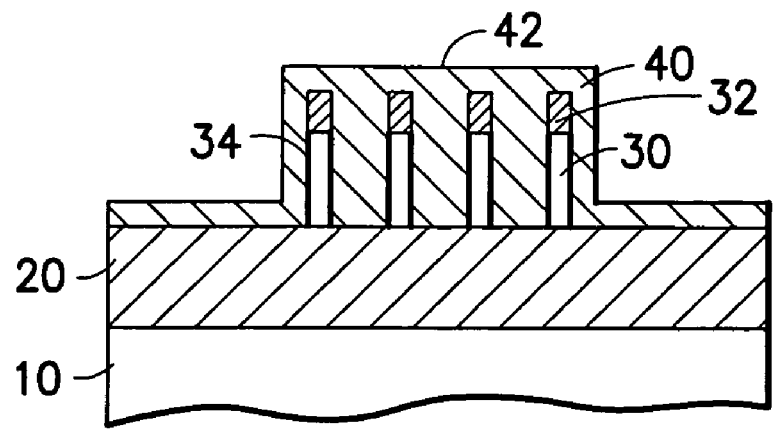
FIG. 2 shows the fins after the deposition of a conformal liner.
Figure 2B:
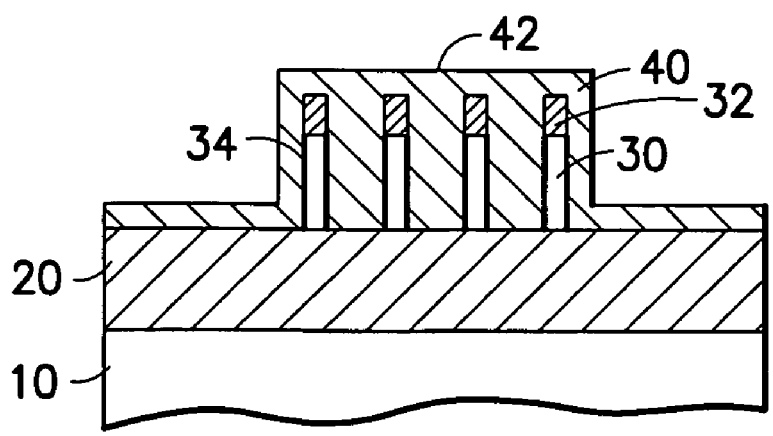

FIGS. 2A and 2B show the result of forming a sacrificial oxide 34 along the fin sidewalls. The oxide is either thermally grown or deposited to a thickness of 50 Å (Preferred range 10 Å–200 Å). Then a CVD nitride 40 is deposited conformally around the fins. The thickness is preferably chosen such that the space between the fins is filled by the nitride, the thickness range of the nitride can be 50 Å to 1000 Å. FIGS. 2A and 2B show the same structure in the body area and the S/D area.

Figure 3A:
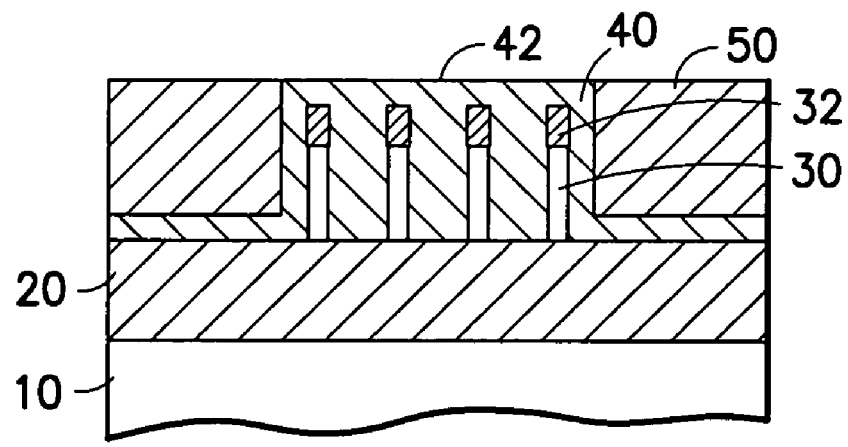
FIGS. 3A and 3B show the fins after a deposition and planarization step that fills the fin region up to the height of the conformal liner.
Figure 3B:
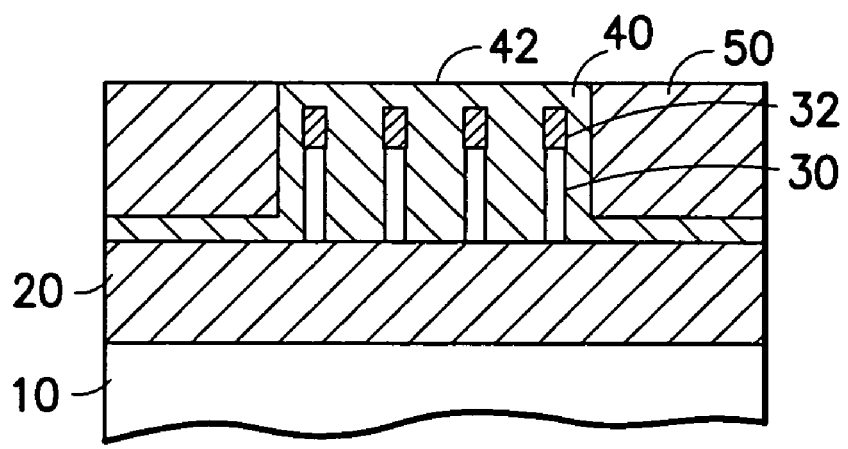

FIGS. 3A and 3B show the result of surrounding the fins with an oxide 50 that will define an aperture area when nitride 40 is removed in a later step.

A CVD oxide 50 is deposited and planarized to the nitride level on top of the fins. CMP or etch back techniques can be used for oxide planarization FIGS. 3A and 3B show that there is the same structure in both cross sections.

Figure 4A:
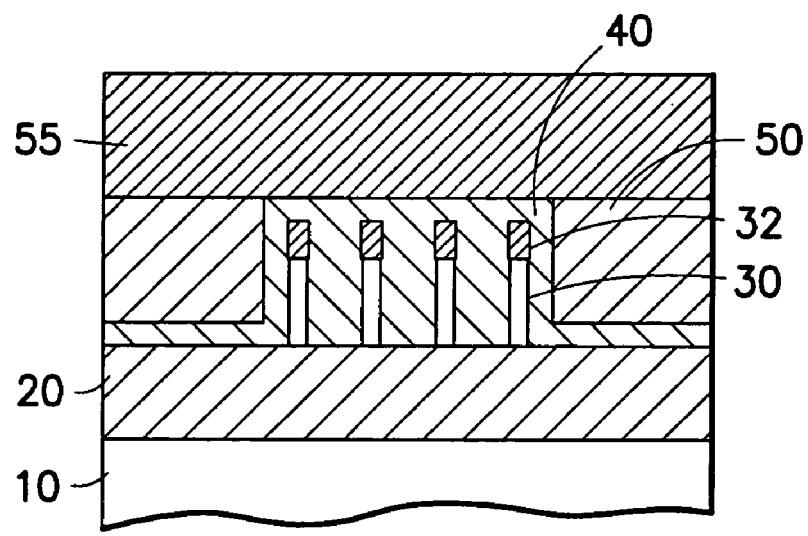
FIGS. 4A and 4B show the corresponding area to FIGS. 3A and 3C after deposition of a second oxide layer.
Figure 4B:
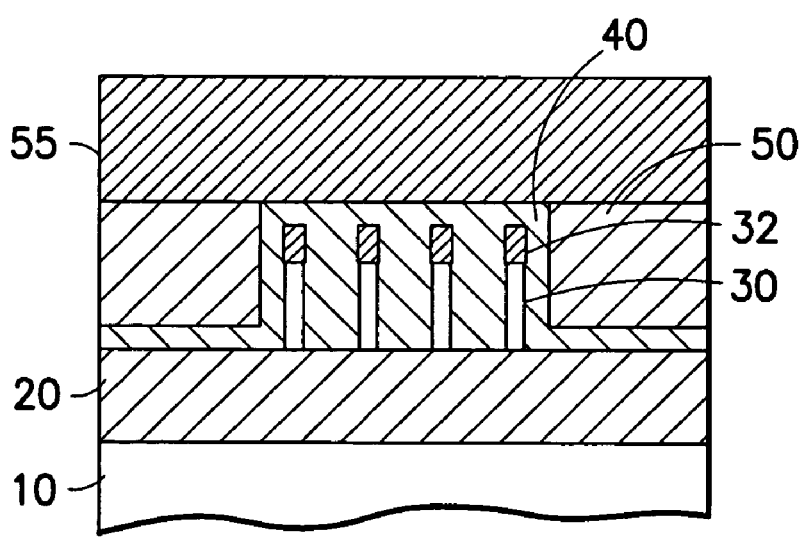

FIGS. 4A and 4B show the result of depositing a second CVD oxide on top of the planarized surface 42 of oxide 50 with a thickness of at least the height from BOX 20 to surface 42. This height is necessary for processing the gate nitride spacer later in the process. Oxide deposition in FIGS. 3 and 4 could be also done in one deposition process followed by a planarization step, with the disadvantage of not having a nitride layer 40 to stop on, so the total thickness control of the oxide might be worse. The result shows the same structure in the S/D area and in the gate area.

Figure 5A:
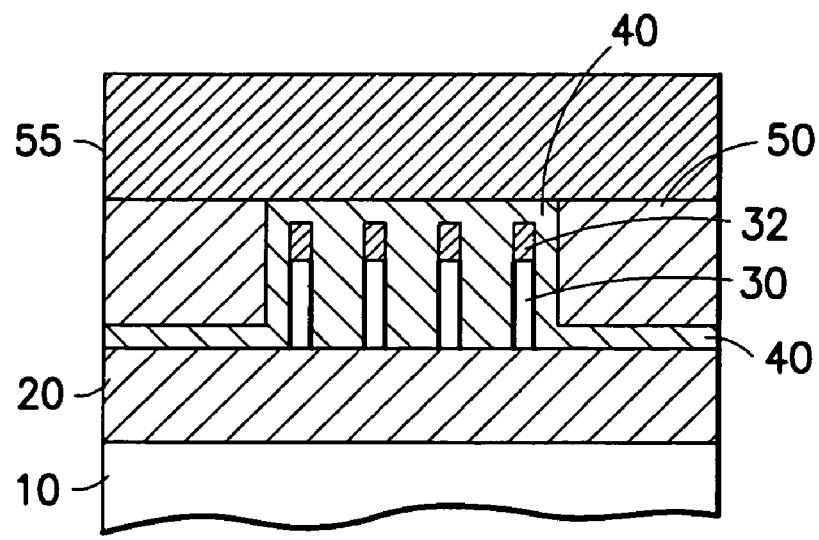
FIGS. 5A and 5B show the previous figures after the formation of a damascene aperture for the transistor gate.
Figure 5B:
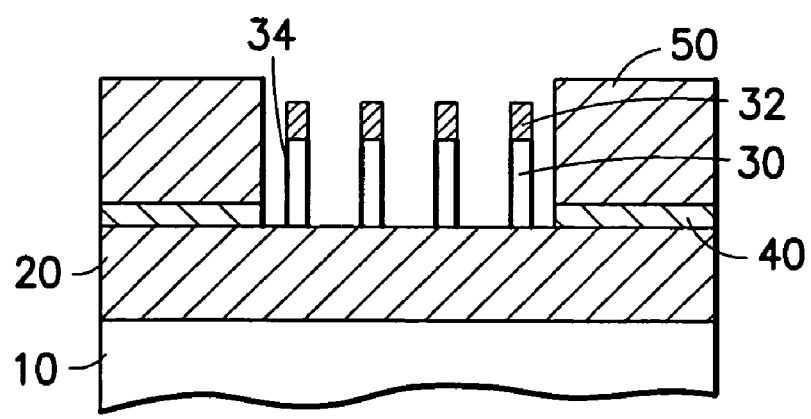

FIG. 5B shows the area where the fin will be locally thinned. The area definition can be done by lithography (optical or e-beam), or sidewall image transfer techniques. With the appropriate mask (e.g. resist) in place to protect areas of the circuit outside the FinFET gate region (e.g. the S/D area), the oxide 55 is etched first by RIE down to the nitride 40, then the nitride 40 is etched by RIE down to the buried oxide 20, selective to oxide 50, leaving an aperture for the transistor body (shown in top view in FIG. 6C). FIG. 5A shows that the S/D areas are unaffected by the aperture etching process.

Figure 6A:
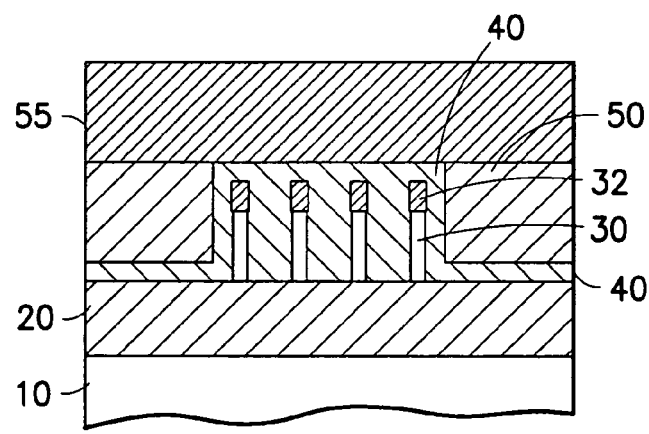
FIGS. 6A–6C show the result of thinning the fins in the transistor body area.
Figure 6B:
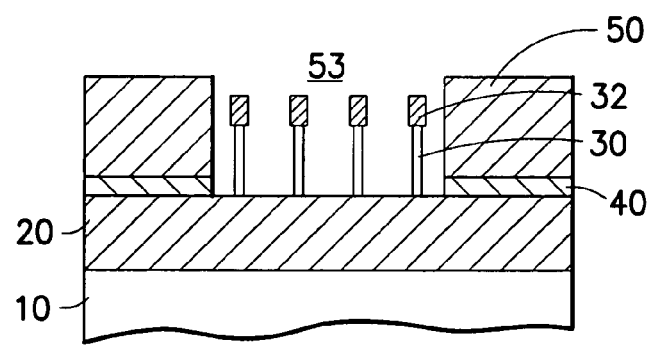
Figure 6C:
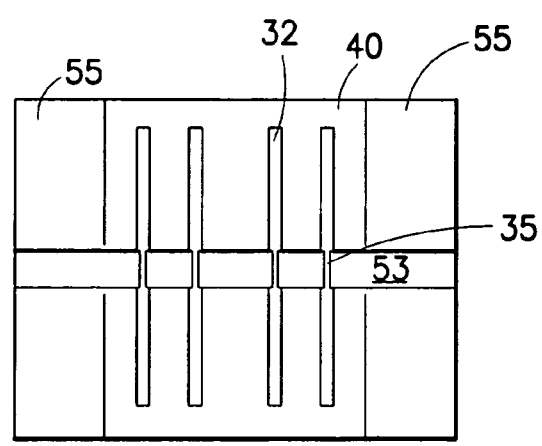

FIG. 6B shows the body region of FIG. 5B after the oxide 34 at the sidewalls of the fins has been removed by a wet etch (HF) and the local thinning process been applied to produce thinner fins 35. The local thinning can be done by etching the silicon wet (NH4OH chemistry), dry (Isotropic plasma) or by local oxidation and removing the oxide by wet or dry etch techniques. FIG. 6A shows the S/D area as unchanged. FIG. 6C shows a top view with a thinner body area 35 in aperture 53. Blocks 55 at the left and right of FIG. 6C show the portions of oxide 55 that were outside aperture 53. As FIG. 6A shows, oxide 55 extends left-right across the area shown in the Figures. In FIG. 6C, oxide 55 is shown as cut away in the central portion to show an unobstructed top view of the fins, denoted with numeral 32, since the top view shows the oxide cap on the fins 30. The fins are embedded in nitride 40, as shown in FIG. 6A.

At this point there are two general ways to continue FinFET processing, one with a lithographically aligned gate, the other one with a selfaligned gate. The flow with lithographically aligned gate continues with the growth of sacrificial oxide and stripping the nitride in the wider area of the fin. This is then followed by standard FinFET processing. The gate is lithographically defined over the thin fin region.

The process flow with the preferred embodiment of the selfaligned gate is described in the following paragraphs.

Figure 7A:
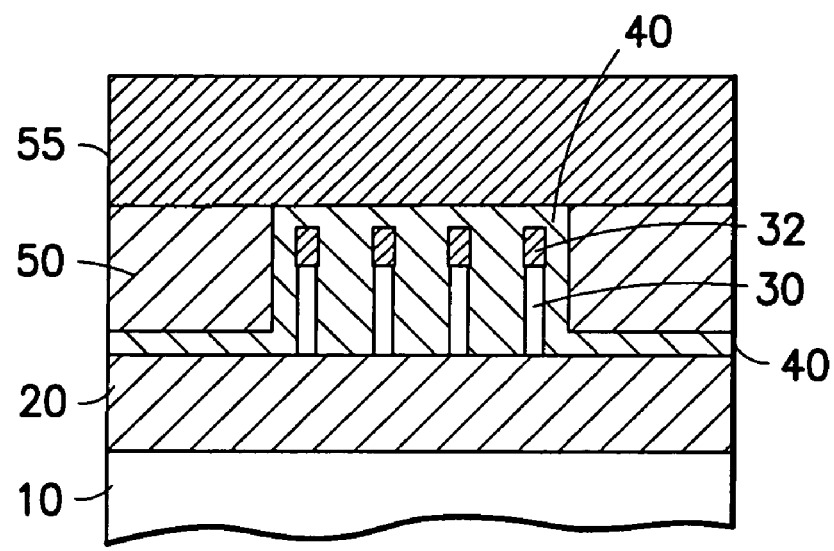
FIGS. 7A and 7B show the result of forming the transistor gates.
Figure 7B:
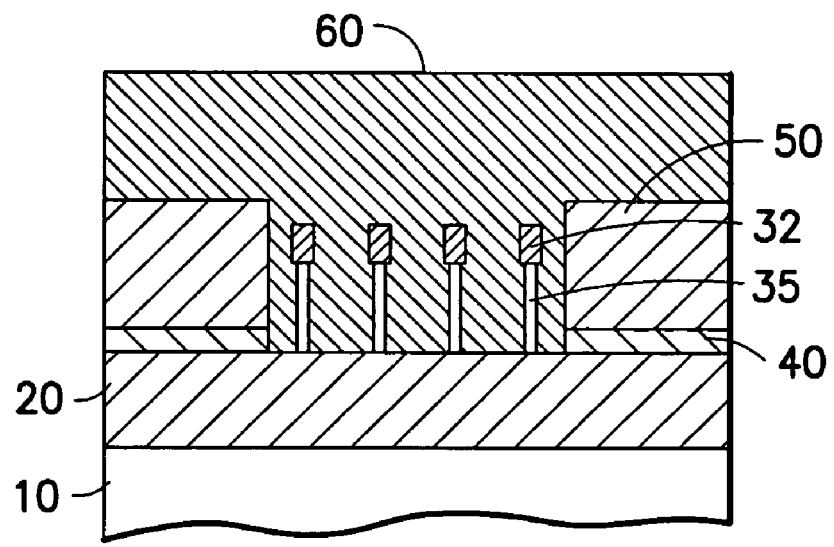

FIG. 7B shows the result of forming the FinFET gate 60. First, a gate oxide (shown as the edge 36 of fins 35) is thermally grown on the sidewalls of the fins 35 with a thickness of 10 Å (Preferred range 5A (or thinnest possible oxide) to 100 Å (Depending on fin thickness)). Alternatively, a gate oxide can be deposited with a similar target range. Then the gate conductor 60 (polysilicon, amorphous silicon, metal) is deposited within the damascene aperture 53 shown in FIG. 6C and planarized down to the level of oxide 55, using CMP or etchback techniques. FIG. 7A is the same as FIG. 6A, showing that the activity in this step is confined to the aperture 53.

Figure 8A:
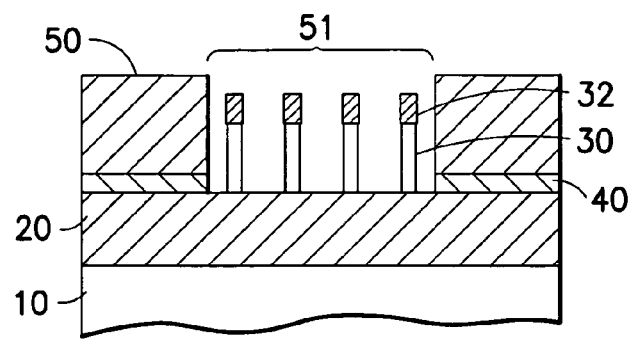
FIGS. 8A–8C show the result after etching the second oxide layer and the conformal liner outside of the gate conductor area.
Figure 8B:
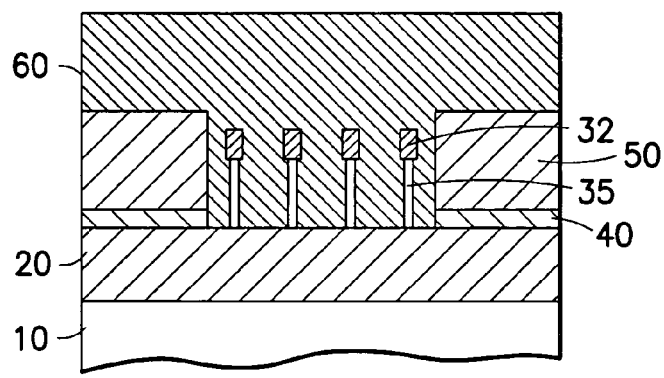
Figure 8C:
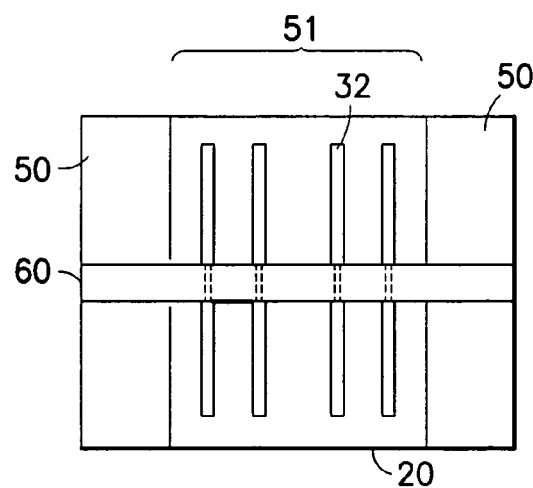

FIG. 8A shows the FINFET structure in the S/D area after oxide etch (RIE) of oxide 55 down to the level of nitride 40 and nitride etch (RIE) of nitride 40 down to the buried oxide 20 in the region where the fins 30 are wider. The area of the etch is denoted with bracket 51 in FIGS. 8A and 8C. Both etch processes are selective to the gate conductor (fin 30) material.

The following process steps are optional and may be done after the S/D area is cleared in the preceding step: Oxidation of the gate sidewalls (Target 35A, Preferred range 10 Å B 100 Å), CVD oxide liner deposition (Target 50 Å, Preferred range 10 Å–500 Å). To set the right Vt and to control the short channel effect halo and extension ion implants are processed.

Figure 9A:
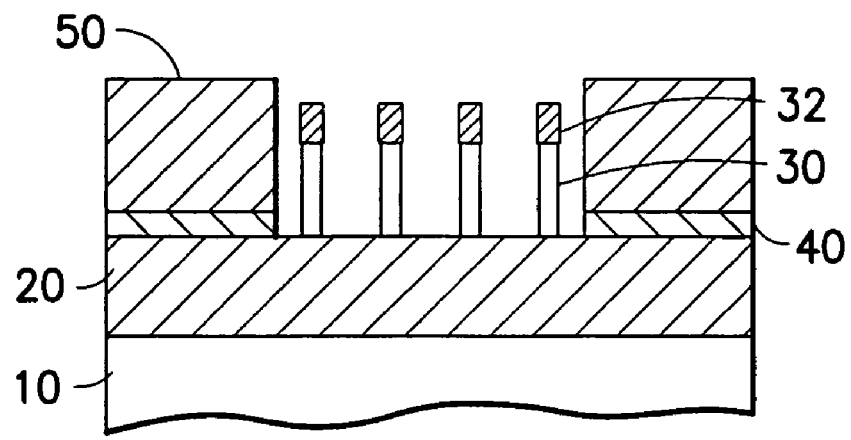
FIGS. 9A and 9B show deposition on the gate and etching of a conformal liner to expose the fins in the S/D area.
Figure 9B:
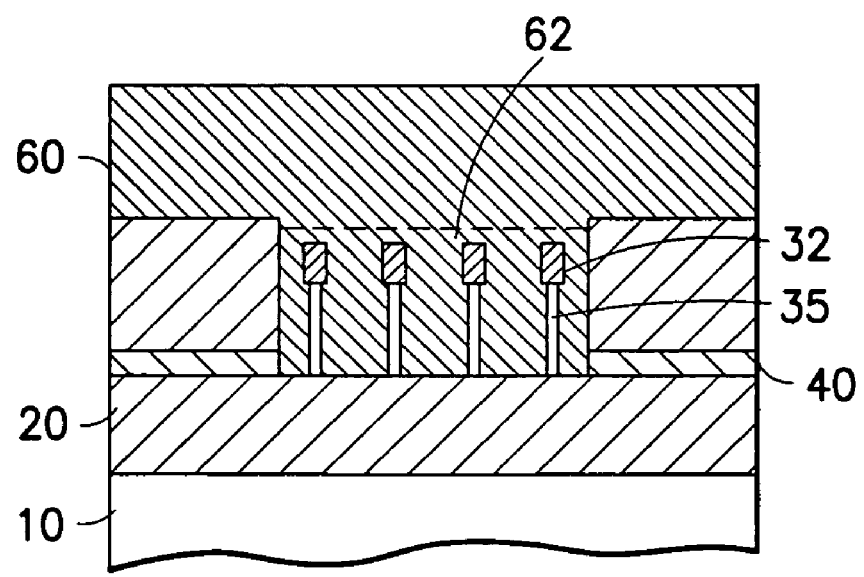

According to the invention, fins 30 in the S/D area will be made thicker than their initial value in order to decrease resistance of the device. As discussed above, it is necessary that the gate not short to the source or drain after the thickening process. The following steps produce an isolating dielectric layer on the lower portion of the gate 60, located up to the height of the fins 30.

aa nitride liner denoted with line 62 in FIG. 9B is deposited over the gates and the fins (Target 400 Å, Preferred range 50 Å–1000 Å) and etched by RIE to form nitride spacers along the gate conductor.

Since the nitride 62 etch is directional, a long nitride overetch is necessary to clear the sidewalls of the fins from the nitride, therefore the nitride etch has to be very selective to oxide. If the nitride etch were less directional, a transverse component of the etch would clear the fins faster, but not leave the required spacer on the gate 60.

Thus, the spacer etch removes spacer 62 from the top of gate 60 and fins 30 and then continues to remove, from the top, the portion of the conformal layer that is adhering to the vertical surfaces of the fins and the gate. The height difference between the gate and the fins specified above comes into play at this time. The nitride is removed from the fins, so that it does not block the thickening process. During that period, the nitride will also be removed from the upper portion of gate 60. The condition on the relative height of the gate 60 and the fins 30 is therefore that, when the fins are cleared, nitride 62 remains adhering to the North and South sides of gate 60 up to a height above the source and drain materials. The result shown in FIG. 9A is that there is an opening in the S/D area where the nitride liner has been etched all the way down to the BOX. In the gate, the nitride RIE etch has gone down the same distance, but, since the gate is higher, there remains a nitride spacer that has a height higher than the silicon fins 30. In front of the plane of FIG. 9B, there will be a nitride liner, denoted with dashed line 62 representing the top surface of the nitride liner, extending E-W across the aperture denoted with bracket 51 in FIG. 8.

Figure 10A:
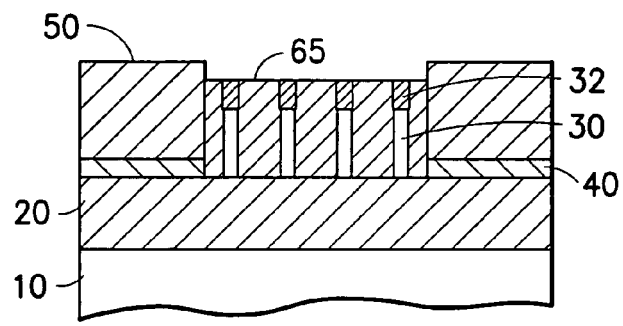
FIGS. 10A and 10B show cross sections at the end and middle of the fins after epitaxial deposition of additional silicon on the fins in the S/D area.

FIG. 10 Å shows the result of an epitaxial (epi) growth that expands the fins 30. After clearing the conformal nitride 62, 34 the oxide on the fin sidewalls 30 is removed by wet etch (HF), then the fins are grown wider using selective silicon or silicon-germanium epitaxy to produce material 65, shown as filling the aperture between oxide blocks 50 and surrounding fins 30. The epitaxial growth also occurs on the upper portion of the gate conductor, where poly is exposed. Epitaxial fill 65 is shown as being at the same level as the top of oxide 32 on fins 30, but the height is not critical. Epi 65 may be only partly overlapping vertically oxide caps 32.

Figure 10B:
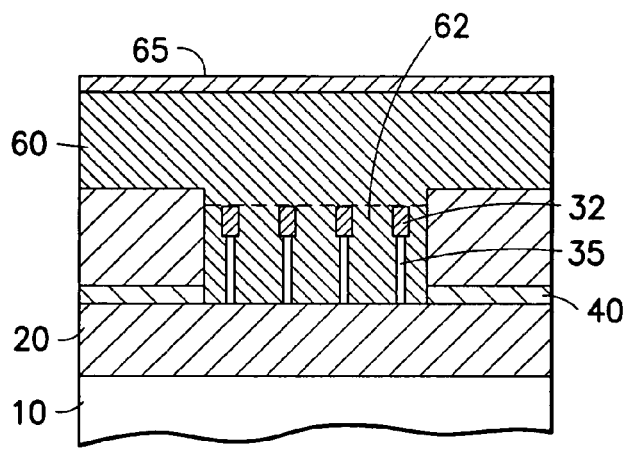
Figure 10C:
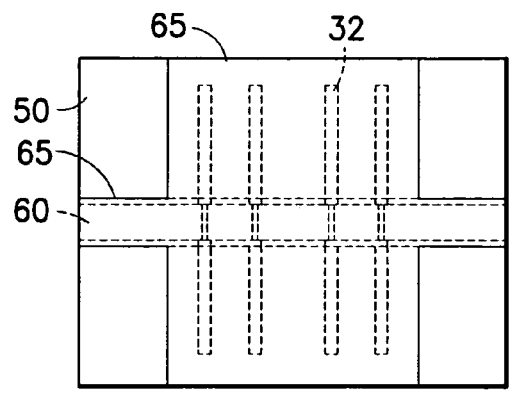
FIG. 10C shows a top view of the structure shown in FIGS. 10A and 10B.

FIG. 10C shows a top view, in which epi 65 fills the area between fins 30 (denoted with numeral 32, since fins 30 are below the oxide 32). Epi 65 also forms a liner on the N and S sides of gate 60. Gate 60 is shown with a dotted outline, since it is below the epi 65. Nitride liner 62 is also directly below epi 65 in FIG. 10C. FIG. 10B is the same as FIG. 9B, with the addition of epi 65 on top of gate 60.

The next steps are source/drain ion implant, silicidation, contact formation processes and metallization.

Each of the described processes then continues with a standard FinFET process such as that described in J. Kedzierski et al., IEEE Transactions on Electron Devices v.50 n.4 April 2003 p. 952–958, or any other convenient method of putting down gates on the fins and then performing standard back end processing, well known to the art.

While the invention has been described in terms of a single preferred embodiment, those skilled in the art will recognize that the invention can be practiced in various versions within the spirit and scope of the following claims.

What is claimed is:

1. A method of forming a FinFET comprising the steps of:
    forming at least one fin having a fin height and a fin thickness on a silicon substrate;
    forming a gate, having a gate height greater than said fin height and intersecting said fin in a body area;
    forming a conformal layer over said gate and fins;
    etching said conformal layer directionally until said conformal layer is removed in a source/drain area of said fins, thereby forming a gate cover over said gate up to said fin height; and
    increasing said fin thickness while said gate is isolated from said set of fins by said gate cover.

2. A method according to claim 1, in which said gate height is such that said gate cover has a height greater than or equal to said fin height after said step of etching said conformal layer.

3. A method according to claim 2, further comprising a step of depositing at least one temporary layer over said FinFET;
    forming a damascene aperture in said temporary layer intersecting said fin in a body area of said fins; and
    forming a gate in said damascene aperture.

4. A method according to claim 3, further comprising a step of thinning said fin in said damascene aperture, thereby reducing an initial fin thickness in a body region of said fin.

5. A method according to claim 4, further comprising a step of depositing an epitaxial material on said fins, thereby increasing an initial fin thickness.

6. A method according to claim 3, further comprising a step of depositing an epitaxial material on said fins, thereby increasing an initial fin thickness.

7. A method according to claim 1, further comprising a step of depositing at least one temporary layer over said FinFET;
    forming a damascene aperture in said temporary layer intersecting said fin in a body area of said fins; and
    forming a gate in said damascene aperture.

8. A method according to claim 7, further comprising a step of thinning said fin in said damascene aperture, thereby reducing an initial fin thickness in a body region of said fin.

9. A method according to claim 7, further comprising a step of depositing an epitaxial material on said fins, thereby increasing an initial fin thickness.

10. A method according to claim 8, further comprising a step of depositing an epitaxial material on said fins, thereby increasing an initial fin thickness.

11. A FinFET comprising at least one fin having a fin height and a fin thickness on a silicon substrate;
   a gate, having a gate height greater than said fin height formed intersecting said fin in a body area;
   a gate cover layer formed by etching a conformal layer disposed over said gate and fins;
   said conformal layer having been etched directionally until said conformal layer is removed in a source/drain area of said fins, thereby forming said gate cover over said gate up to said fin height; and
   an epitaxial material increasing said fin thickness while said gate is isolated from said set of fins by said gate cover.

12. A FinFET according to claim 11, in which said gate height is such that said gate cover has a height greater than or equal to said fin height after said step of etching said conformal layer.

13. A FinFET according to claim 12, in which said gate is selfaligned to a body of said FinFET;
   in a damascene aperture in a temporary layer intersecting said fin in a body area of said fins.

14. A FinFET according to claim 13, in which said fin is thinned in said damascene aperture, thereby reducing an initial fin thickness in a body region of said fin.

15. A FinFET according to claim 14, in which said fins have a layer of epitaxial material, thereby increasing an initial fin thickness.

16. A FinFET according to claim 13, in which said fins have a layer of epitaxial material, thereby increasing an initial fin thickness.

17. A FinFET according to claim 11, in which said gate is selfaligned to a body of said FinFET;
   in a damascene aperture in a temporary layer intersecting said fin in a body area of said fins.

18. A FinFET according to claim 17, in which said fin is thinned in said damascene aperture, thereby reducing an initial fin thickness in a body region of said fin.

19. A FinFET according to claim 18, in which said fins have a layer of epitaxial material, thereby increasing an initial fin thickness.

20. A FinFET according to claim 17, in which said fins have a layer of epitaxial material, thereby increasing an initial fin thickness.

* * * * *